United States Patent
Schapendonk et al.

(10) Patent No.: US 10,705,125 B1
(45) Date of Patent: Jul. 7, 2020

(54) ONLINE SUPPLY CURRENT MONITORING

(71) Applicant: NXP B.V., Eindhoven (NL)

(72) Inventors: Edwin Schapendonk, Oss (NL);
Marijn Nicolaas van Dongen, Utrecht (NL); Maciej Skrobacki, Heteren (NL); Wouter van der Heijden, Nijmegen (NL); Petrus Antonius Thomas Marinus Vermeeren, Eindhoven (NL)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 16/585,237

(22) Filed: Sep. 27, 2019

(51) Int. Cl.
*G01R 19/25* (2006.01)
*G05F 1/46* (2006.01)

(52) U.S. Cl.
CPC ........... *G01R 19/2513* (2013.01); *G05F 1/46* (2013.01)

(58) Field of Classification Search
None
See application file for complete search history.

(56) References Cited

U.S. PATENT DOCUMENTS

| | | | | |
|---|---|---|---|---|
| 7,429,806 B2 * | 9/2008 | Bainbridge | ............... | G06F 1/26 307/52 |
| 9,306,457 B2 | 4/2016 | Searles et al. | | |
| 10,122,168 B2 * | 11/2018 | Goncalves | ............... | G05F 1/10 |
| 2018/0081382 A1 | 3/2018 | Tsao et al. | | |

* cited by examiner

Primary Examiner — Jeffery S Zweizig
(74) Attorney, Agent, or Firm — Charlene R. Jacobsen

(57) ABSTRACT

An integrated circuit includes a load circuit having multiple functional modules, a first voltage regulator configured to provide a supply voltage to the multiple functional modules, and a supply current monitoring circuit including a second voltage regulator and a current monitor, the second voltage regulator being configured to provide a test supply voltage. A switch matrix is interconnected between the first voltage regulator, the supply current monitoring circuit, and the functional modules. Each of the functional modules in successive order is a module under test, and the switch matrix is configured to disconnect the first voltage regulator from the module under test and connect the supply current monitoring circuit to the module under test such that the second voltage regulator provides the test supply voltage to the module under test and the current monitor measures a supply current of the module under test in response to the test supply voltage.

19 Claims, 7 Drawing Sheets

ONLINE SUPPLY CURRENT MONITORING

TECHNICAL FIELD OF THE INVENTION

The present invention relates generally to integrated circuits. More specifically, the present invention relates to online supply current monitoring of functional modules of an integrated circuit during operation.

BACKGROUND OF THE INVENTION

As the functional components of integrated circuit (IC) have decreased in size, the number of functions integrated onto ICs has commensurately increased. These functions may be separated into functional units or functional modules, each of which may serve a different purpose. These functional modules may be digital, analog, or mixed-signal. Additionally, some ICs may implement a voltage regulator on the same die as the functional modules to power the functional modules.

Some ICs are required to meet stringent requirements for functional safety. By way of example, safety is a critical objective for systems that may cause harm if component or system failure is not mitigated, such as in safety-critical applications in the automotive domain. Accordingly, functional safety is increasingly requiring continuous monitoring of the analog and mixed-signal circuits in safety-critical applications without disturbing the normal functionality of the IC. In digital IC testing, some structured test methods such as scan-test and built-in self-testing have already become common practice. However, continuous monitoring for functional safety of analog and mixed-signal circuits during operation faces several challenges. In particular, defects in and an aging effect of analog circuits are difficult to detect without disturbing the normal functionality of the IC.

SUMMARY

Aspects of the disclosure are defined in the accompanying claims.

In a first aspect, there is provided an integrated circuit comprising a load circuit having multiple functional modules, a first voltage regulator configured to provide a supply voltage to the multiple functional modules, a supply current monitoring circuit including a second voltage regulator and a current monitor, the second voltage regulator being configured to provide a test supply voltage, and a switch matrix interconnected between the first voltage regulator, the supply current monitoring circuit, and the functional modules, wherein each of the functional modules in successive order is a module under test, and for the module under test, the switch matrix is configured to disconnect the first voltage regulator from the module under test and connect the supply current monitoring circuit to the module under test such that the second voltage regulator provides the test supply voltage to the module under test and the current monitor measures a supply current of the module under test in response to the test supply voltage.

In a second aspect, there is provided a method comprising providing a supply voltage from a first voltage regulator to multiple functional modules of a load circuit of an integrated circuit in a functional mode and testing each of the functional, wherein the functional module undergoing testing is a module under test, and the testing comprises disconnecting the first voltage regulator from the module under test, connecting a supply current monitoring circuit to the module under test, providing a test supply voltage from a second voltage regulator of the supply current monitoring circuit, and measuring, at a current monitor of the supply current monitoring circuit, a supply current of the module under test in response to providing the test supply voltage.

In a third aspect, there is provided an integrated circuit comprising a load circuit having multiple functional modules, a first voltage regulator configured to provide a supply voltage to the multiple functional modules, a supply current monitoring circuit including a second voltage regulator and a current monitor, the second voltage regulator being configured to provide a test supply voltage, and a switch matrix interconnected between the first voltage regulator, the supply current monitoring circuit, and the functional modules, wherein each of the functional modules in successive order is a module under test, and for the module under test, the switch matrix is configured to connect the supply current monitoring circuit to the module under test such that the second voltage regulator provides the test supply voltage to the module under test and the current monitor measures a supply current of the module under test in response to the test supply voltage, the switch matrix is further configured to disconnect the first voltage regulator from the module under test after the second voltage regulator of the supply current monitoring circuit begins providing the test supply voltage to the module under test, and the switch matrix is further configured to enable continued connection of the first voltage regulator to the remaining ones of the multiple functional modules to provide the supply voltage to the remaining ones of the multiple functional modules while the module under test is connected to the supply current monitoring circuit.

BRIEF DESCRIPTION OF THE DRAWINGS

The accompanying figures in which like reference numerals refer to identical or functionally similar elements throughout the separate views, the figures are not necessarily drawn to scale, and which together with the detailed description below are incorporated in and form part of the specification, serve to further illustrate various embodiments and to explain various principles and advantages all in accordance with the present invention.

DETAILED DESCRIPTION

Figure 1:
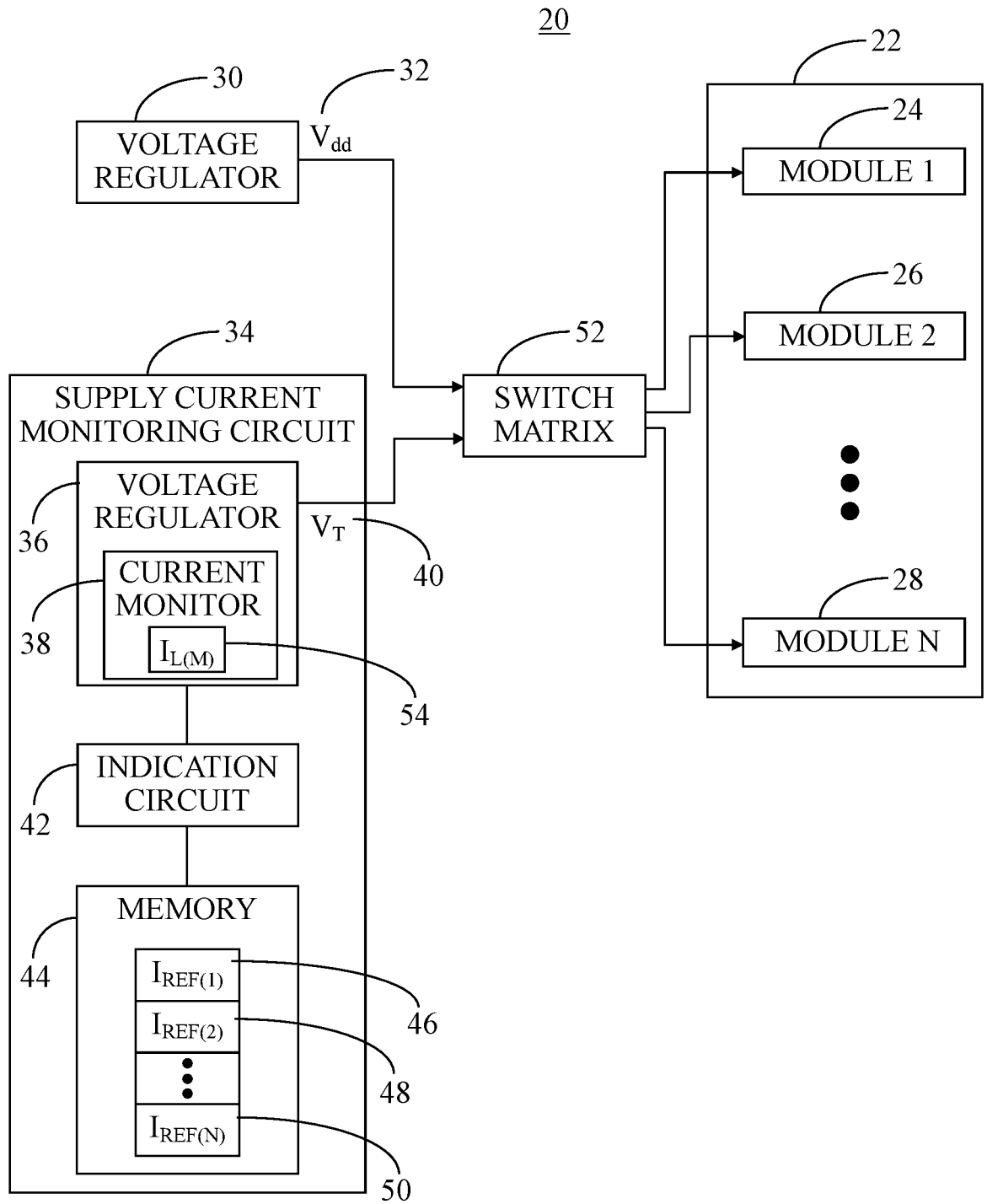
FIG. 1 shows a block diagram of an integrated circuit (IC) in accordance with an embodiment.

In overview, the present disclosure concerns a system and methodology for online current monitoring of functional modules of an integrated circuit (IC). More particularly, the system and methodology enable continuous monitoring of supply currents to analog, mixed-signal and/or digital circuits (which may alternatively be referred to herein as circuitry domains) within the IC without disturbing the normal functional behavior of the IC. For analog circuits, a number of failures results in a change of the supply current to a particular functional module. For example, a defect in a gate oxide may compromise the biasing conditions of one or more branches, thereby changing the supply current. However, supply current changes associated with the failure of a single functional module within the IC may be too small to detect reliably when monitoring an overall supply current for the IC. Consequently, embodiments entail measuring a supply current of each functional module separately in order to detect small changes in supply current. Accordingly, such a technique may be implemented to detect defects in and/or an aging effect of particular analog functional circuits within an IC. Further, since each functional module is being tested separately, it can be possible to detect which specific functional module of the IC is failing. The failing functional module may then be disabled and/or even replaced by a redundant functional module to maintain the overall functionality of the IC.

The instant disclosure is provided to further explain in an enabling fashion at least one embodiment in accordance with the present invention. The disclosure is further offered to enhance an understanding and appreciation for the inventive principles and advantages thereof, rather than to limit in any manner the invention. The invention is defined solely by the appended claims including any amendments made during the pendency of this application and all equivalents of those claims as issued. It should be understood that the use of relational terms, if any, such as first and second, top and bottom, and the like are used solely to distinguish one from another entity or action without necessarily requiring or implying any actual such relationship or order between such entities or actions.

Much of the inventive functionality and many of the inventive principles are best implemented with or in integrated circuits (ICs) including possibly application specific ICs (ASICs) or ICs with integrated processing or control or other structures. It is expected that one of ordinary skill, notwithstanding possibly significant effort and many design choices motivated by, for example, available time, current technology, and economic considerations, when guided by the concepts and principles disclosed herein will be readily capable of generating such ICs and structures with minimal experimentation. Therefore, in the interest of brevity and minimization of any risk of obscuring the principles and concepts according to the present invention, further discussion of such structures and ICs, if any, will be limited to the essentials with respect to the principles and concepts of the various embodiments.

Referring to FIG. 1, FIG. 1 shows a block diagram of an integrated circuit (IC) 20 in accordance with an embodiment. In general, IC 20 includes a load circuit 22 having multiple functional modules 24, 26, 28 and a first voltage regulator 30 which is configured to regulate and provide a supply voltage 32, $V_{dd}$, to functional modules 24, 26, 28. In this example, functional module 24 is a first functional module, designated by the number "1." Functional module 26 is a second functional module, designated by the number "2." And, functional module 28 is an Nth functional module, designated by the letter "N." Ellipses between functional modules 26 and 28 denote that load circuit 22 can include any number of functional modules. In the illustrated embodiments, first voltage regulator 30 may be configured to provide only a single supply voltage to each of functional modules 24, 26, 28. However, in alternative embodiments, first voltage regulator 30 may be suitably configured to provide multiple differing supply voltages.

Each of functional modules 24, 26, 28 is configured to perform one of the functions of load circuit 22 of IC 20. In general, functional modules 24, 26, 28 may be any type of circuitry and may be analog, digital, and/or mixed signal. Therefore, functional modules 24, 26, 28 may alternatively be considered circuitry domains. In accordance with embodiments described herein, IC 20 further includes a supply current monitoring circuit 34 for performing current testing (sometimes referred to as ICCQ testing) of any of functional modules 24, 26, 28 that are in the analog or mixed signal domain and/or for performing current testing (sometimes referred to as IDDQ testing) of any of functional modules 24, 26, 28 that are in the digital domain. Moreover, the testing is performed while IC 20 is in a functional mode, e.g., while IC 20 is operational. Such testing is referred to herein as online supply current monitoring. Those skilled in the art will understand that digital functional modules may also undergo online testing by implementing scan-test, built-in self-testing, and/or so forth.

In accordance with an embodiment, supply current monitoring circuit 34 includes a second voltage regulator 36 with a current monitor 38. Second voltage regulator 36 is configured to provide a test supply voltage 40, in which test supply voltage 40 is equivalent to supply voltage 32. In some embodiments, supply current monitoring circuit 34 may include an indication circuit 42 and a memory element 44 configured to store reference current values 46 ($I_{REF(1)}$), 48 ($I_{REF(2)}$), 50 ($I_{REF(N)}$) associated with corresponding first, second, and Nth functional modules 24, 26, 28. Reference current values 46 may have been measured, for example, during production testing and thereafter stored in memory element 44. IC 20 further includes a switch matrix 52 interconnected between first voltage regulator 30, supply current monitoring circuit 34, and functional modules 24, 26, 28 of load circuit 22.

As will be demonstrated in significantly greater detail below, for each of functional modules 24, 26, 28 in successive order (which may also be referred to herein as individually in a sequence, individually in a random order, one at a time, or one-by-one), switch matrix 52 is configured to disconnect first voltage regulator 30 from one of functional modules 24, 26, 28 that is to undergo testing (referred to herein as a module under test) and connect supply current monitoring circuit 34 to the module under test such that second voltage regulator 36 provides test supply voltage 40 to the module under test and current monitor 38 measures a load current 54, $I_{L(M)}$ (also referred to as a supply current), of the module under test in response to test supply voltage 40. In some embodiments, supply current monitoring circuit 34 is configured to compare the measured load current 54 with the corresponding reference current value 46, 48, 50 stored in memory element 44. In some embodiments, indication circuit 42 is configured to provide an indication of a difference between load current 54 and the corresponding reference current value 46, 48, 50. A malfunction of the module under test may be indicated when the difference is outside of a predetermined threshold range. Although not shown herein, online supply monitoring circuit 34 may include control circuitry in the form of hardware, software, or a combination of hardware and software for controlling the selection of the module under test, controlling the switch matrix, and executing the measuring and comparing operations.

Figure 2:
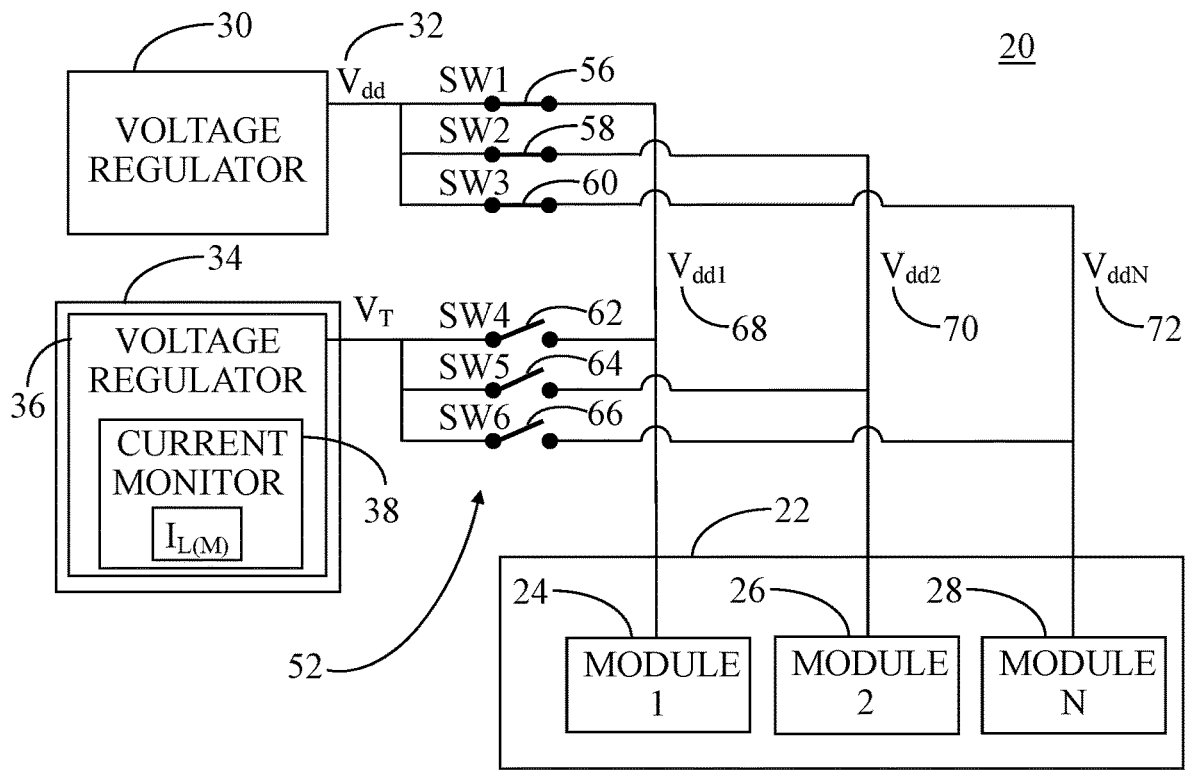
FIG. 2 shows a simplified block diagram of the IC during normal operation of the IC.

FIG. 2 shows a simplified block diagram of IC 20 during normal operation of the IC 20. As mentioned above, functional modules 24, 26, 28 will be connected one-by-one to second voltage regulator 36 of supply current monitoring circuit 34 and disconnected from first voltage regulator 30 via switch matrix 52. After one of functional modules 24, 26, 28 (e.g., the module under test) is connected to second voltage regulator 36, its load current 54 (FIG. 1) can be measured. Switching from first voltage regulator 30 to second voltage regulator 36 and back to first voltage regulator 30 should be done such that the functionality of the module under test is not influenced. This may be done by non-overlapped switching (e.g., first voltage regulator 30 is disconnected and thereafter second voltage regulator 36 is connected). However, a non-overlapped switching technique may require internal buffering in the form of, for example, a decoupling capacitor.

In accordance with some embodiments, overlapped switching (e.g., second voltage regulator 36 is connected and providing test supply voltage 40 prior to first voltage regulator 30 being disconnected) is implemented. FIG. 2 and subsequent FIGS. 3-4, demonstrate the overlapped switching technique. For simplicity, indication circuit 42 (FIG. 1) and memory 44 (FIG. 1) are not depicted in FIGS. 2-4. However, switch matrix 52 is depicted in FIGS. 2-4 in an expanded form to more clearly demonstrate the overlapped switching taking place in accordance with some embodiments.

In FIG. 2, first voltage regulator 30 is connected to all of functional modules 24, 26, 28 in an online, or operational, mode during which functional modules 24, 26, 28 of load circuit 22 can perform their intended function. In this example, first, second, and third switches 56, 58, 60 of switch matrix 52 are all closed to connect first voltage regulator 30 to functional modules 24, 26, 28. Conversely, fourth, fifth, and sixth switches 62, 64, 66 of switch matrix 52 are all open so that second voltage regulator 36 of supply current monitoring circuit 34 is disconnected from functional modules 24, 26, 28. Thus, functional modules 24, 26, 28 are all provided with supply voltage 32. Supply voltage 32 is provided as input voltages 68, 70, 72 to functional modules 24, 26, 28. In this example, input voltages 68, 70, 72 are denoted by different designators (e.g., $V_{dd1}$, $V_{dd2}$, $V_{ddN}$) to correspond with functional modules 24, 26, 28. However, input voltages 68, 70, 72 may each have the same magnitude as supply voltage 32.

Figure 3:
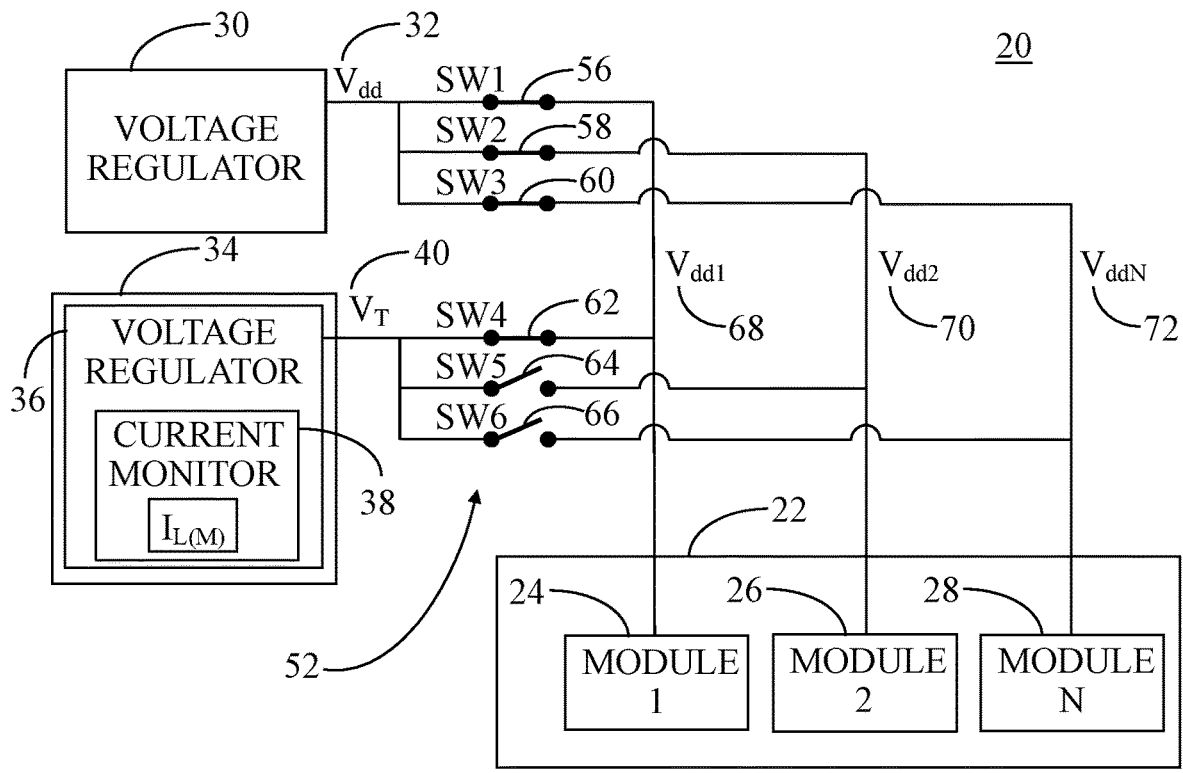
FIG. 3 shows the block diagram of FIG. 2 at an onset of testing one of the functional modules.

FIG. 3 shows the block diagram of FIG. 2 at an onset of testing one of the functional modules. In this example, first functional module 24 is to undergo testing, and is therefore the module under test. Accordingly, in the overlapped switching model, fourth switch 62 between second voltage regulator 36 and first functional module 24 closes at a first instant during which first switch 56 between first voltage regulator 30 and first functional module 24 is also closed. Thus, at the first instant, switch matrix 52 is configured to connect second voltage regulator 36 of supply current monitoring circuit 34 to first functional module 24 during which first voltage regulator 30 is still connected to first functional module 24. Accordingly, at the instant demonstrated in FIG. 3, first and second voltage regulators 30, 36 operate in parallel to provide voltages 32, 40 to first functional module 24. Fourth switch 62 (and similarly, fifth and sixth switches 64, 66) should have a resistance sufficient so that the remaining functional modules 26, 28 are not also supplied by second voltage regulator 36.

Figure 4:
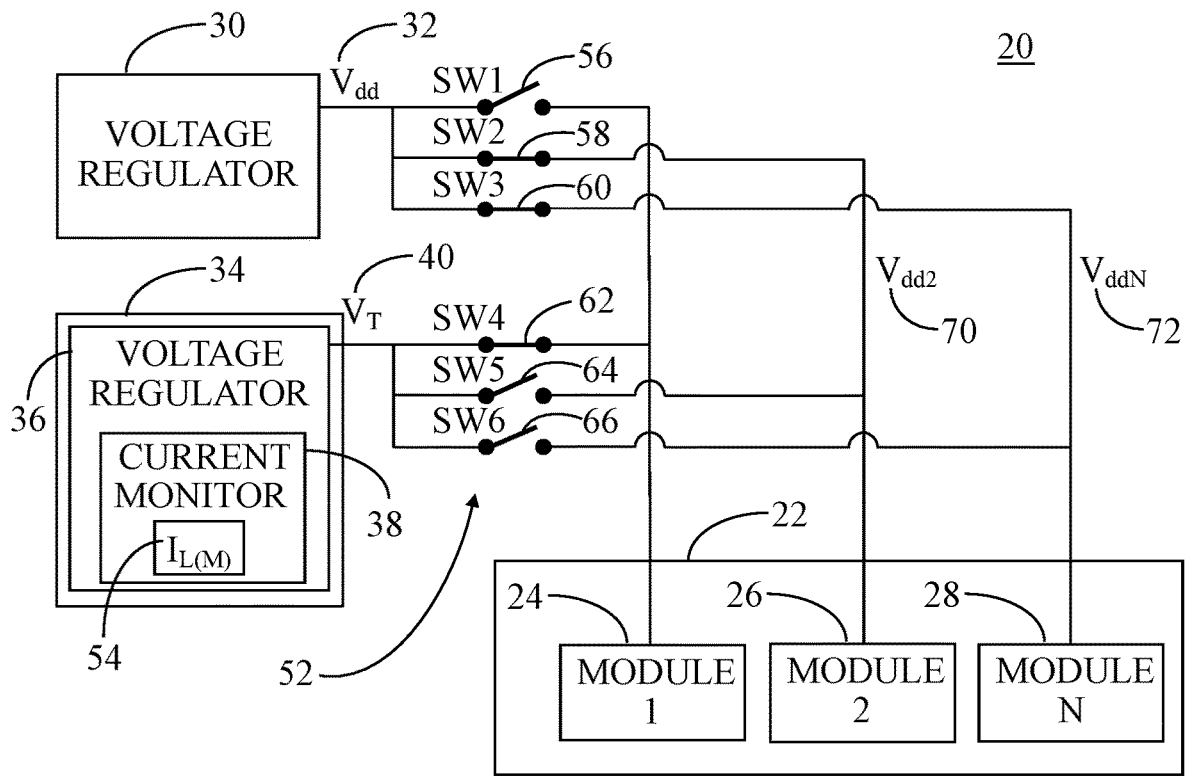
FIG. 4 shows the block diagram of FIG. 3 during testing of a particular functional module.

FIG. 4 shows the block diagram of FIG. 3 during testing of a particular functional module. Continuing from the configuration of FIG. 3 in which both of first and fourth switches 56, 62 are closed, switch matrix 52 is further configured to disconnect first voltage regulator 30 from first functional module 24 (e.g., the module under test) at a second instant following the first instant. That is, first switch 56 of switch matrix 52 is opened so that first functional module 24 is only being supplied the test supply voltage 40 by second voltage regulator 36. However, switch matrix 52 is configured to enable continued connection of first voltage regulator 30 to the remaining functional modules 26, 28 while first functional module 24 is connected to second voltage regulator 36 of supply current monitoring circuit 34.

The configuration of FIG. 4 enables continued functional operation of all functional modules 24, 26, 28 of load circuit 22. However, test supply voltage 40 from second voltage regulator 36 is now being provided to first functional module 24 in lieu of supply voltage 32 as input voltage 68 (see FIG. 2) from first voltage regulator 30. Since second voltage regulator 36 is only supplying power to one of functional modules (e.g., first functional module 24 in this example), the output current capability of second voltage regulator 36 can be scaled down relative to the output current capability of first voltage regulator 30. After, first voltage regulator 30 is disconnected from first functional module 24, the supply current (e.g., load current 54) of first functional module 24 can be measured by current monitor 38.

Figure 5:
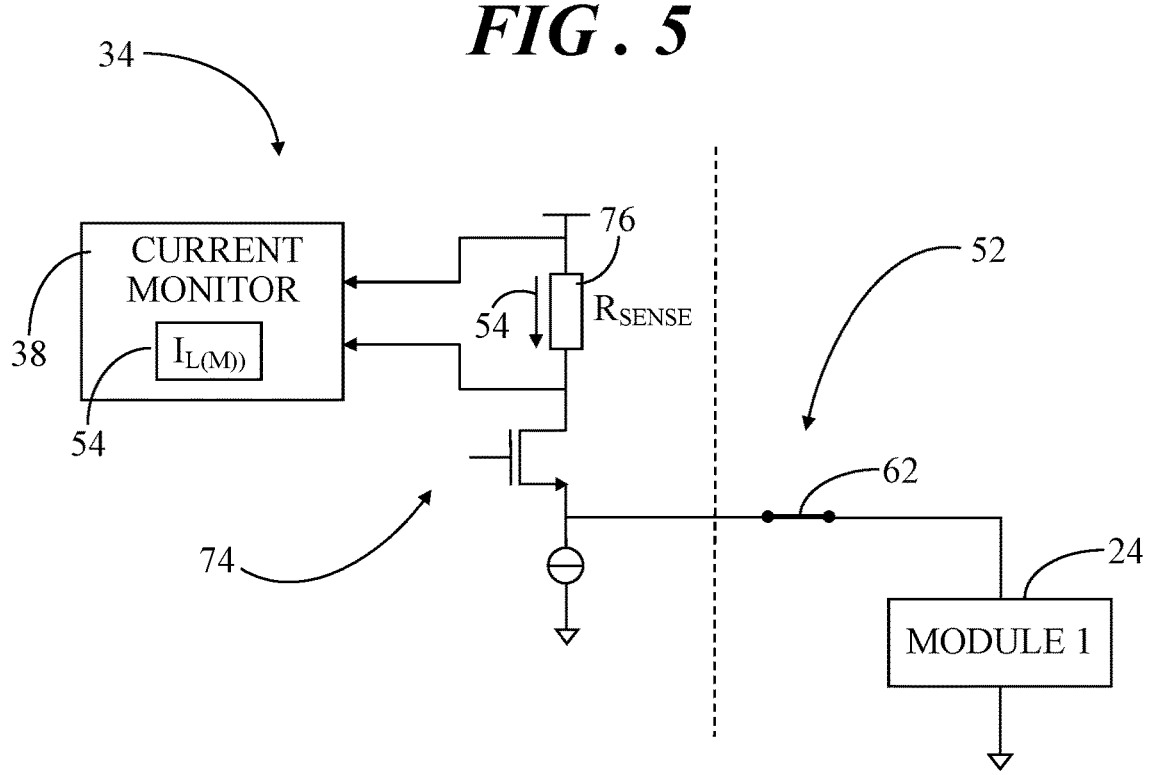
FIG. 5 shows a block diagram of an output stage of the supply current monitoring circuit with a current monitor.

Referring to FIG. 5 in connection with FIG. 4, FIG. 5 shows a block diagram of an output stage 74 of supply current monitoring circuit 34 with current monitor 38. The supply current, e.g., load current 54, also flows through a sense resistor 76, $R_{SENSE}$, so the voltage across sense resistor 76 is proportional to load current 54 of first functional module 24. Current monitor 38 may compare load current 54 against predefined limits which may be stored in memory element 44. Alternatively, the comparison may also be performed in the current domain with current comparators.

Accordingly, FIGS. 2-5 represent a scenario in which first functional module 24 is undergoing online supply current testing. It should be understood, that the remaining functional modules 26, 28 can be tested similarly. For example, first voltage regulator 30 is reconnected to first functional module 24 by closing first switch 56 and second voltage regulator 36 is disconnected from first functional module 24 by opening fourth switch 62. Thereafter, first voltage regulator 30 may be disconnected from second functional module 26 by opening second switch 58 and second voltage regulator 36 may be connected to second functional module 26 by closing fifth switch 64 in accordance with the overlapped switching technique discussed above. Next, first voltage regulator 30 may be disconnected from Nth functional module 28 by opening third switch 60 and second voltage regulator 36 may be connected to Nth functional module 28 by closing sixth switch 66 in accordance with the overlapped switching technique discussed above.

FIGS. 1-6 provide an example configuration in which an integrated circuit includes a single supply current monitoring circuit. Some embodiments may include multiple supply current monitoring circuits, each of which performs supply current testing on differing subsets of the functional modules within the integrated circuit. The multiple supply current monitoring circuits could function concurrently to perform supply current testing in order to enable faster throughput time and/or faster error-detection.

Figure 6:
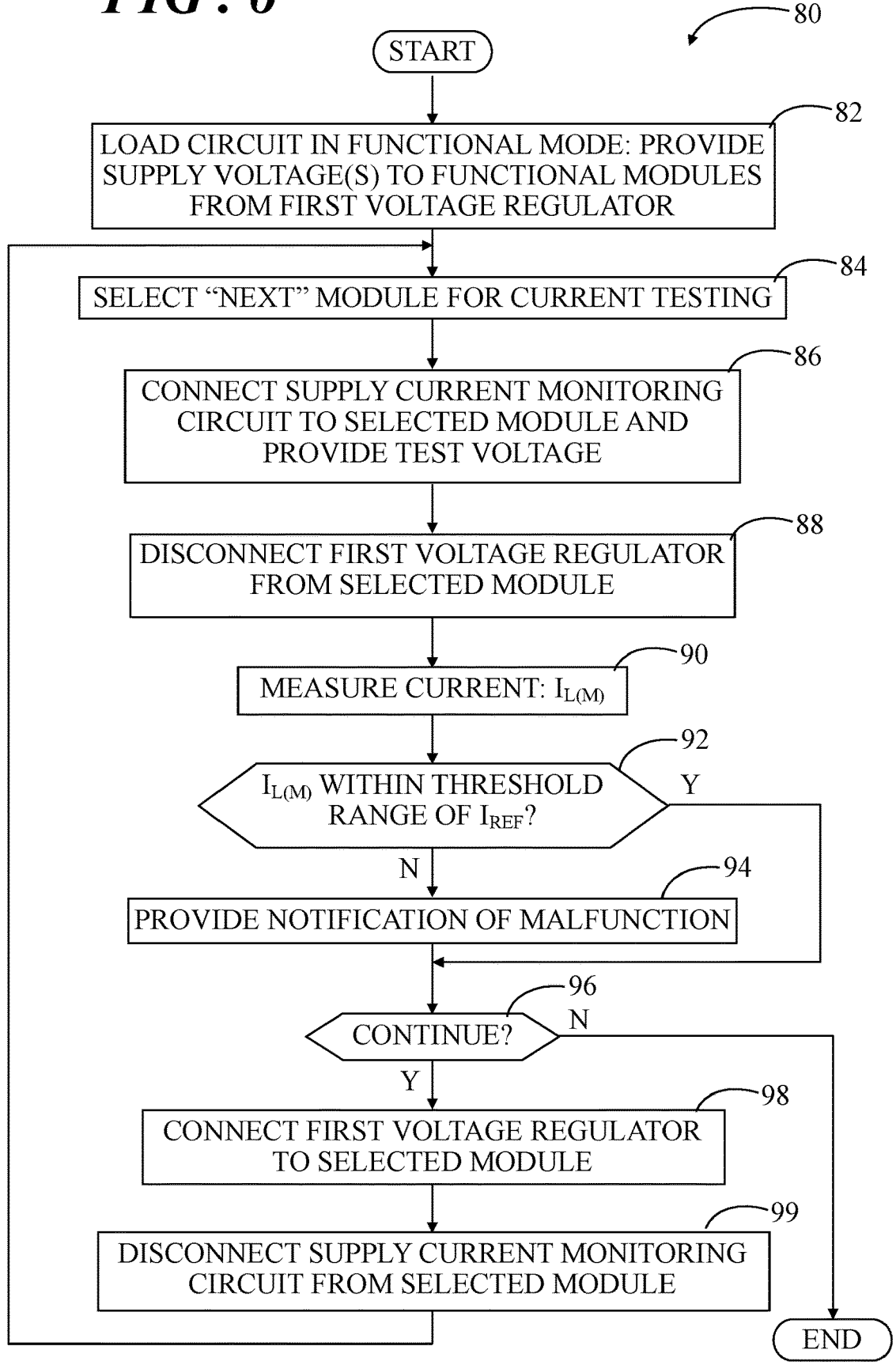
FIG. 6 shows a flowchart of an online supply current monitoring process in accordance with another embodiment.

FIG. 6 shows a flowchart of an online supply current monitoring process 80 in accordance with another embodiment. Process 80 may be performed utilizing supply current monitoring circuit 34 discussed in connection with FIGS. 1-5. Accordingly, reference can be made to FIGS. 1-5 in connection with the following description of the functional blocks of online supply current monitoring process 80. Process 80 may also be performed by circuit/hardware configurations that are configured to perform the functions called for by the various process steps.

At block 82, load circuit 20 is placed in a functional mode. In particular, supply voltage 32 as input voltages 68, 70, 72 are provided from first voltage regulator 30 to functional modules 24, 26, 28 of load circuit 22 of IC 20, as demonstrated in FIG. 2. At block 84, a next functional module is selected for current testing. Of course, during a first iteration of process 80, the "next" functional module can be any functional module that is initially selected for testing. For purposes of illustration, the "next" functional module (e.g., a module under test) will be first functional module 24 in the following description.

At block 86, supply current monitoring circuit 34 is connected to the selected functional module. More particularly, second voltage regulator 36 of supply current monitoring circuit 34 may be connected to first functional module 24 by closing fourth switch 62 as demonstrated in FIG. 3. Additionally at block 86, test supply voltage 40 is provided from second voltage regulator 36 of supply current monitoring circuit 34 to the selected first functional module 24. As such, at block 86, voltages 68 and 40 are concurrently provided to first functional module 24. Furthermore, test supply voltage 40 may be equivalent to input voltage 68, $V_{dd1}$. In the meantime, the remaining functional modules 26, 28 that are not currently undergoing testing continue to be provided supply voltage 32 as input voltages 70, 72. At block 88, first voltage regulator 30 is disconnected from the selected first functional module 24 by opening first switch 56 so that first functional module 24 is only receiving test supply voltage 40 as demonstrated in FIG. 4.

At block 90, load current 54, $I_{L(M)}$, is measured at current monitor 38 of supply current monitoring circuit 34 in response to provision of test supply voltage 40, after disconnecting first voltage regulator 30 from first functional module 24. Load current 54 may be replicated (and possibly scaled) at sense resistor 76 of output stage 74 as demonstrated in FIG. 5. Alternatively, load current 54 may be directly tapped from a node in second voltage regulator 36. An indication of load current 54 of first functional module 24 may be then be generated. The indication may be a current demanded by first functional module 24, which may be reflective of the current consumed by first functional module 24.

At a query block 92, indication circuit 42 compares the measured supply current with a reference current associated with the module under test. By way of example, indication circuit 42 may provide an indication of a difference between load current 54 measured for first functional module 24 and the corresponding reference current value 46, $I_{REF(1)}$. In some embodiments, indication circuit 42 may determine whether load current 54 is within a threshold range of reference current value 46. For example, the threshold range may be within ±5% of reference current value 46. However, other thresholds and/or ranges may be envisioned. When a determination is made that the measured load current 54 is not within the threshold range of reference current value 46, process control continues at block 94. At block 94, supply current monitoring circuit 34 may provide an indicator, value, or some type of notification to load circuit 22, to a functional safety monitoring circuit (not shown), or any other control circuit that the selected first functional module 24 may be malfunctioning. Since the module under test is being tested separately from the remaining functional modules, it can therefore be possible to detect the specific module that is failing. Along with providing an indication of the fault, the failing functional module may then be disabled and/or even replaced by a redundant functional module to maintain the overall functionality of the IC.

Following block 94 or when a determination is made at block 92 that the selected first functional module 24 is within the threshold range of reference current value 46, a determination is made at a query block 96 as to whether online supply current monitoring process 80 is to continue. When process 80 is to be discontinued (e.g., IC 20 is being powered down, a possible malfunction is catastrophic, and so forth) process 80 ends. However, when execution of online supply current monitoring process 80 is to continue, process control continues with block 98. At block 98, the module under test is again connected to first voltage regulator 30 and at block 99, supply current monitoring circuit 34 is disconnected from the module under test.

Thereafter, process control loops back to block 84 to select the "next" functional module for current testing as the module under test (e.g., second functional module 26) via the execution of process blocks 86, 88, 90, 92, 94, 96, 98, and 99. Hence, each functional module 24, 26, 28 may be tested in successive order (e.g., individually in a sequence, individually in a random order, one at a time, or one-by-one) without disturbing the normal functional behavior of the IC 20. Furthermore, current monitoring may be performed continuously during operation of IC 20 to thereby satisfy functional safety requirements. Still further, by testing the functional modules one at a time, small current changes associated with the failure of a single functional module may be detected, which might otherwise be too small to detect reliably when monitoring the overall supply current of load circuit 22. Accordingly, the inclusion of supply current monitoring circuit 34 and switch matrix 52 into IC 20 may yield an effective safety mechanism for IC 20.

The flowchart of FIG. 6 demonstrates the overlapped switching technique. However, alternative embodiments may implement a non-overlapped switching technique, as mentioned above. In a non-overlapped switching configuration, the order of functional blocks 86 and 88 may be reversed. That is, the first voltage regulator is first disconnected from the selected module (block 88) and thereafter the supply current monitoring circuit is connected to the selected module and the test supply voltage is provided (block 86). Similarly, the order of functional blocks 98 and 99 may be reversed such that the supply current monitoring circuit is disconnected from the selected module (block 99) and thereafter the first voltage regulator is connected to the selected module (block 98).

Figure 7:
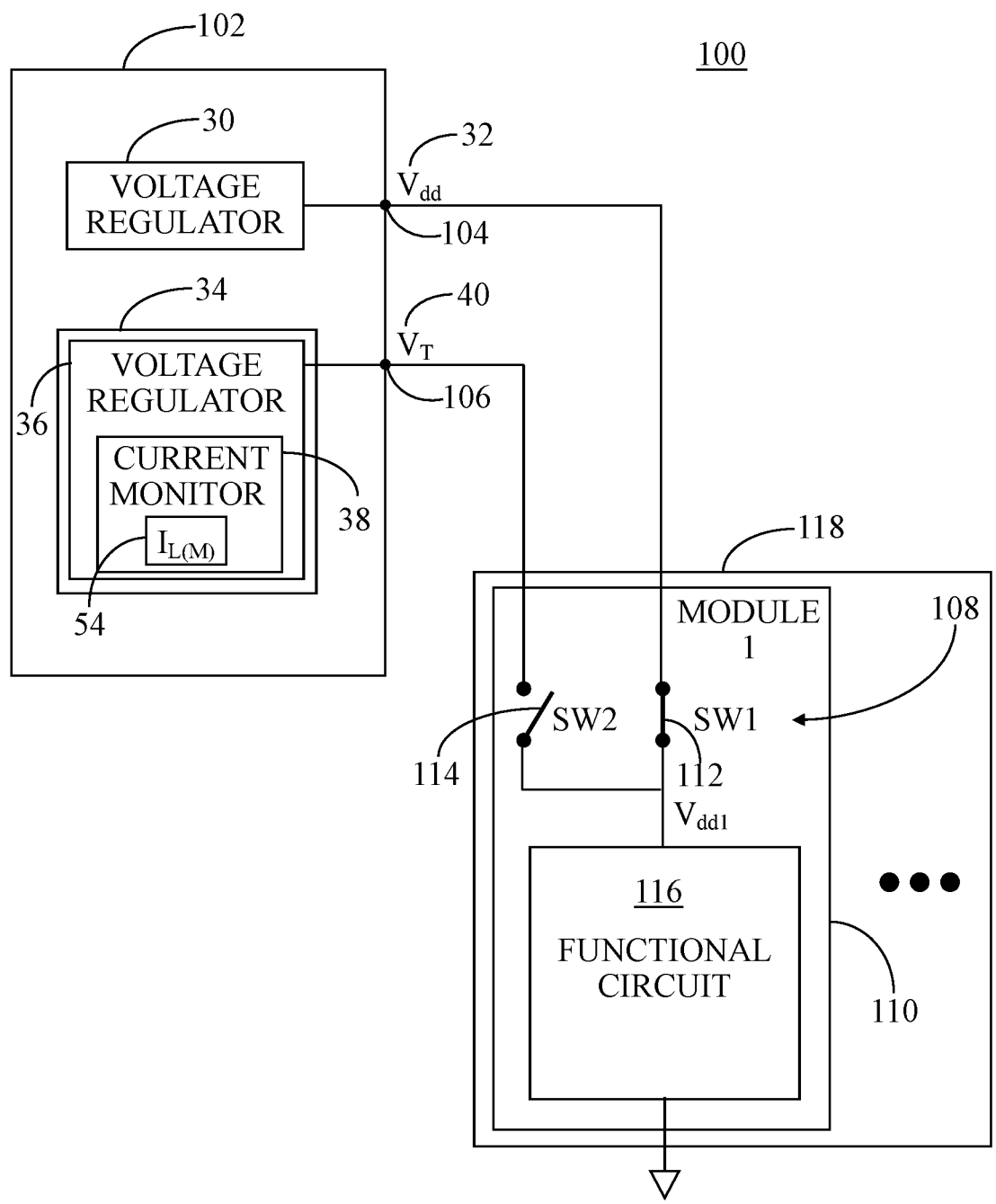
FIG. 7 shows a block diagram of a portion of an integrated circuit (IC) implementing the supply current monitoring circuit in accordance with another embodiment.

FIG. 7 shows a block diagram of a portion of an integrated circuit (IC) 100 implementing supply current monitoring circuit 34 in accordance with another embodiment. In the configuration of FIG. 7, IC 100 includes a regulator system 102 having a first output 104 and a second output 106. First voltage regulator 30 and second voltage regulator 36 of supply current monitoring circuit 34 are combined in regulator system 102. Supply voltage 32, $V_{dd}$, is provided via first output 104 and test supply voltage 40 is provided via second output 106. By combining first and second voltage regulators 30, 36 in regulator system 102, references may be shared which may assist in ensuring that both supply voltage 32 and test supply voltage 40 are equivalent.

Additionally, in IC circuit 100, all switches within a switch matrix 108 of IC 100 are implemented in a shell around the analog functional modules. For example, IC 100 includes a functional module 110. Functional module 110 includes a first switch 112, SW1, of switch matrix 108, a second switch 114, SW2, of switch matrix 108, and functional circuitry 116. In general, first switch 112 is configured for connection of first voltage regulator 30 to functional circuitry 116 and second switch 114 is configured for connection of second voltage regulator 36 to functional circuitry 116 in accordance with the methodology described above. Functional circuitry 116 represents the components configured to perform one of the functions of a load circuit 118 of IC 100. Ellipses indicate that IC 100 may include any number of functional modules, each of which include switches of switch matrix 108 implemented in a shell around each analog functional module.

By implementing the switches of switch matrix 108 in a shell around each analog functional module, functional modules can be added or removed without having to change the voltage regulator or the switch matrix. Accordingly, implementation of a large switch matrix which must be adjusted every time analog modules are added or removed can be avoided, thereby simplifying the configuration of IC 100.

IC 100 is shown with both a regulator system and the switches of the switch matrix implemented in a shell around each functional module for simplicity. However, some embodiments may only include the regulator system with a switch matrix as shown in FIGS. 1-4. Alternatively, some embodiments may only include the switches of the switch matrix implemented in a shell around each functional module with separate voltage regulators that are not combined in a regulator system.

Figure 8:
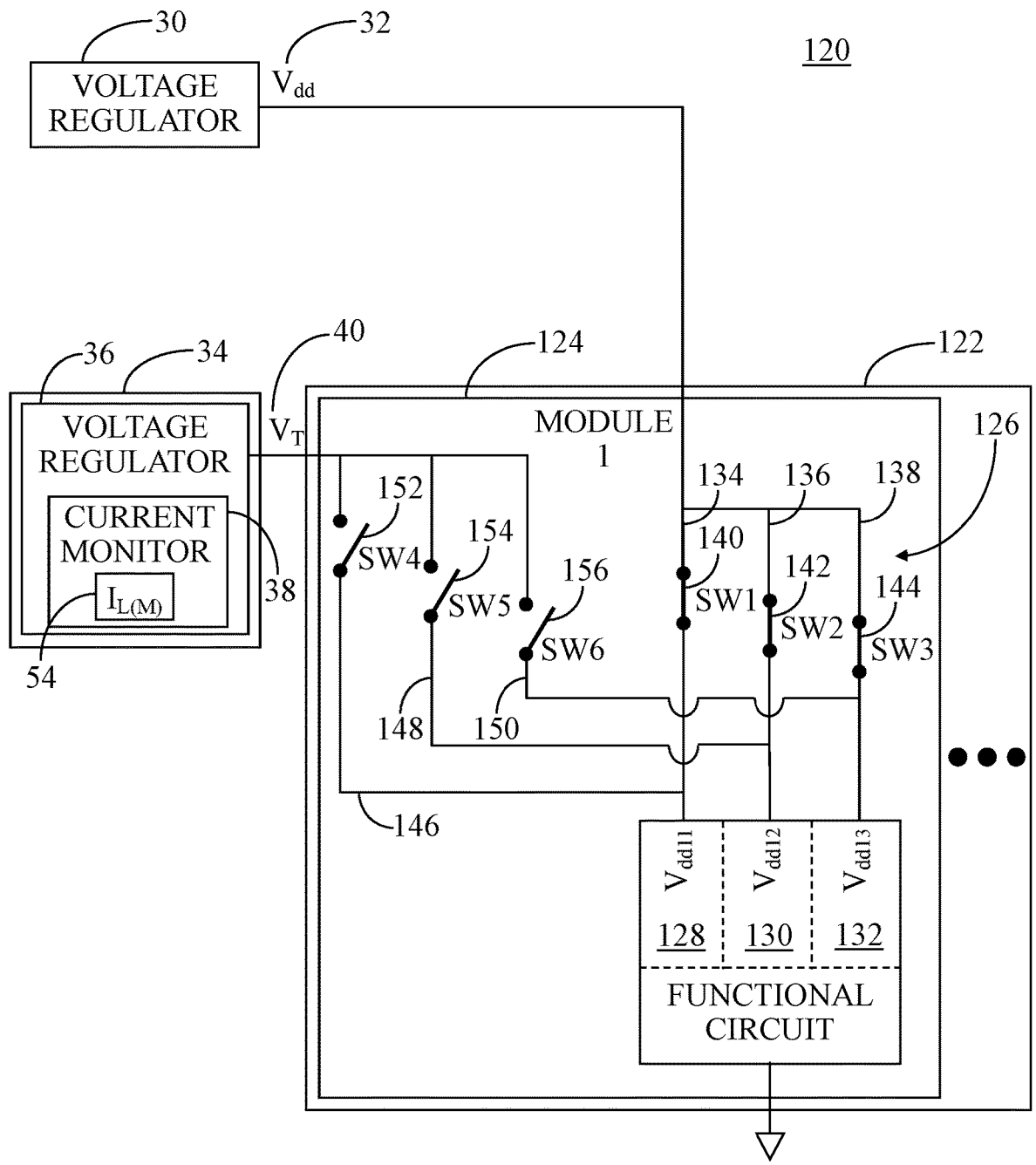
FIG. 8 shows a block diagram of a portion of an integrated circuit (IC) implementing the supply current monitoring circuit in accordance with another embodiment.

FIG. 8 shows a block diagram of a portion of an integrated circuit (IC) 120 implementing supply current monitoring circuit 34 in accordance with another embodiment. All functional modules within an integrated circuit may not have the same load (supply) current 54. Instead, some functional modules may require a relatively large load (supply) current (for example, in the mA range) while other functional modules may require a significantly lower load (supply) current (for example, in the µA range). This situation may set high requirements on the dynamic range of current measurement in current monitor 38 of second voltage regulator 36. The requirement for a wide dynamic range of current measurement may be relaxed if the functional modules have a load (supply) current in the same order of magnitude. For example, if the total supply current to the functional module is greater than a predetermined upper test limit, a determination can be made that the load/supply current is to be split. Accordingly, in some embodiments, functional modules with a large load/supply current requirement may split the load/supply current into multiple functional subdomains which can each be connected to first voltage regulator 30 and second voltage regulator 36 in successive order. Each of the functional subdomains may be configured to have a subdomain supply current that is within the current measurement range of the current monitor.

Thus, IC 120 includes a load circuit 122 that includes a first functional module 124 having a nominal total supply current that is above a current measurement range of current monitor 38. Ellipses indicate that IC 120 may include any number of functional modules (not shown for simplicity). These additional functional modules have a nominal total supply current that may or may not exceed the current measurement range of current monitor 38.

Like functional module 110 (FIG. 7), switches within a switch matrix 126 of IC 120 are implemented in a shell around the analog functional modules of load circuit 122, including first functional module 124. In accordance with some embodiments, first functional module 124 includes functional circuitry that is divided into multiple functional subdomains 128, 130, 132. Although the functional circuitry is divided into three subdomains in this example, other embodiments may have two subdomains or more than three subdomains. Switch matrix 126 includes multiple supply lines 134, 136, 138 selectively connectable between first voltage regulator 30 and corresponding ones of functional subdomains 128, 130, 132 via supply switches 140, 142, 144 (labeled SW1, SW2, SW3). Additionally, switch matrix 126 includes multiple test lines 146, 148, 150 selectively connectable between second voltage regulator 36 of supply current monitoring circuit 34 and corresponding ones of functional subdomains 128, 130, 132 via test switches 152, 154, 156 (labeled SW4, SW5, SW6).

In general, for each of functional subdomains 128, 130, 132 of first functional module 124 in successive order (i.e., one at a time), switch matrix 126 is configured to disconnect first voltage regulator 30 from the functional subdomain by opening one of supply switches 140, 142, 144 of one of supply lines 134, 136, 138 and connect second voltage regulator 36 of supply current monitoring circuit 34 to the functional subdomain by closing one of test switches 152, 154, 156 of one of test lines 146, 148, 150 such that second voltage regulator 36 provides test supply voltage 40 to the functional domain and current monitor 38 measures load current 54 of the functional subdomain in response to test supply voltage 40. The disconnection and connection of voltage regulators 30, 36 can be performed using either of the overlapped or non-overlapped switching techniques described above. Accordingly, each functional subdomain 128, 130, 132 can separately undergo current testing. Further, a subdomain supply current of each functional subdomain 128, 130, 132 can more appropriately fall within the current measurement range of current monitor 38.

Figure 9:
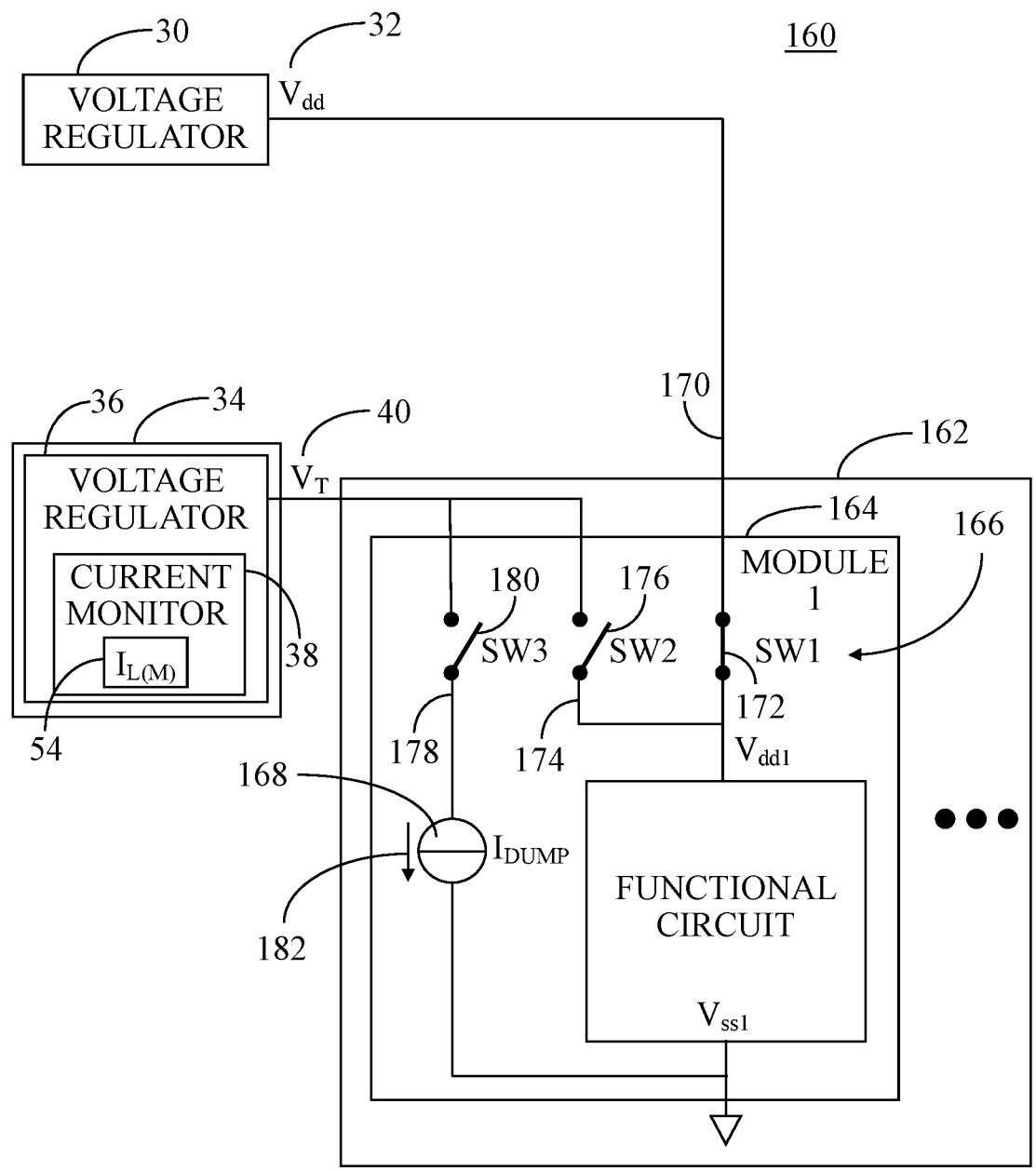
FIG. 9 shows a block diagram of a portion of an integrated circuit (IC) implementing the supply current monitoring circuit in accordance with yet another embodiment.

FIG. 9 shows a block diagram of a portion of an integrated circuit (IC) 160 implementing supply current monitoring circuit 34 in accordance with yet another embodiment. As mentioned above, all functional modules within an integrated circuit may not require the same load (supply) current 54. However, the requirement for wide dynamic range of current measurement may be relaxed if the functional modules have a load (supply) current in the same order of magnitude. For example, if the total supply current to the functional module (or to a functional subdomain of a functional module) is less than a predetermined lower test limit, a determination can be made that a dump current should be added. Accordingly, in some embodiments, functional modules with a low load/supply current requirement may include a current source for adding a dump current.

Thus, IC 160 includes a load circuit 162 that includes a first functional module 164 having a nominal total supply current that is below a current measurement range of current monitor 38. Ellipses indicate that IC 160 may include any number of functional modules (not shown for simplicity). These additional functional modules have a nominal total supply current that may or may not be less than the current measurement range of current monitor 38.

Like functional modules 110 (FIG. 7) and 124 (FIG. 8), switches within a switch matrix 166 of IC 160 are implemented in a shell around the analog functional modules of load circuit 162, including first functional module 164. In accordance with some embodiments, IC 160 includes a current source 168 associated with first functional module 164. Switch matrix 166 includes a supply line 170 selectively connectable between first voltage regulator 30 and first functional module 164 via a first switch 172, SW1. Switch matrix 166 additionally includes a first test line 174 selectively connectable between second voltage regulator 36 of supply current monitoring circuit 34 and first functional module 164 via a second switch 176, SW2, and a second test line 178 selectively connectable between second voltage regulator 36 of supply current monitor 34 via a third switch 180, SW3.

In general, switch matrix 166 is configured to disconnect first voltage regulator 30 from first functional module 164 via first switch 172 of supply line 170, connect second voltage regulator 36 of supply current monitoring circuit 34 to first functional module 164 via second switch 176 of first test line 174, and connect second voltage regulator 36 of supply current monitoring circuit 34 to current source 168 via third switch 180 of second test line 178. The disconnection and connection of voltage regulators 30, 36 and current source 168 can be performed using either of the overlapped or non-overlapped switching techniques described above. Thus, second voltage regulator 36 provides test supply voltage 40 to first functional module 164, first functional module 164 produces a supply current in response to test supply voltage 40, dump current 182 from current source 168 is added to load current 54 to obtain a total current within the current measurement range of current monitor 38, and current monitor 38 measures the total current of first functional module 164 in response to test supply voltage 40. The value of dump current 182 can be subtracted from the measured total current of first functional module 164 to replicate load current 54 of first functional module 164.

Accordingly, various structural configurations described herein enable ICCQ testing of functional modules of subdomains of functional modules that are in the analog or mixed signal domain, and IDDQ testing of any functional modules that are in the digital domain. Numerous variations and modifications will become apparent to those skilled in the art. For example, a single integrated circuit may include a variety of functional module and switch matrix configurations, such as those shown in FIGS. 1, 7, 8, and 9.

Embodiments disclosed herein entail a system and methodology for online current monitoring of functional modules of an integrated circuit (IC). More particularly, the system and methodology enable continuous monitoring of analog supply currents to analog circuits within the IC without disturbing the normal functional behavior of the IC. Embodiments entail measuring a supply current of each functional module or a subdomain of a functional module separately in order to detect small changes in supply current. Such a technique may be implemented to detect defects in and/or an aging effect of particular analog functional circuits within an IC.

This disclosure is intended to explain how to fashion and use various embodiments in accordance with the invention rather than to limit the true, intended, and fair scope and spirit thereof. The foregoing description is not intended to be exhaustive or to limit the invention to the precise form disclosed. Modifications or variations are possible in light of the above teachings. The embodiment(s) was chosen and described to provide the best illustration of the principles of the invention and its practical application, and to enable one of ordinary skill in the art to utilize the invention in various embodiments and with various modifications as are suited to the particular use contemplated. All such modifications and variations are within the scope of the invention as determined by the appended claims, as may be amended during the pendency of this application for patent, and all equivalents thereof, when interpreted in accordance with the breadth to which they are fairly, legally, and equitably entitled.

What is claimed is:

1. An integrated circuit comprising:
a load circuit having multiple functional modules;
a first voltage regulator configured to provide a supply voltage to the multiple functional modules;
a supply current monitoring circuit including a second voltage regulator and a current monitor, the second voltage regulator being configured to provide a test supply voltage; and
a switch matrix interconnected between the first voltage regulator, the supply current monitoring circuit, and the functional modules, wherein each of the functional modules in successive order is a module under test, and for the module under test, the switch matrix is configured to disconnect the first voltage regulator from the module under test and connect the supply current monitoring circuit to the module under test such that the second voltage regulator provides the test supply voltage to the module under test and the current monitor measures a supply current of the module under test in response to the test supply voltage.

2. The integrated circuit of claim 1 wherein the test supply voltage is equivalent to the supply voltage.

3. The integrated circuit of claim 1 wherein the switch matrix is further configured to enable continued connection of the first voltage regulator to provide the supply voltage to the remaining ones of the multiple functional modules while the module under test is connected to the supply current monitoring circuit.

4. The integrated circuit of claim 1 wherein the switch matrix is further configured to connect the supply current monitoring circuit to the module under test while the first voltage regulator is connected to the module under test and providing the supply voltage, and the switch matrix is further configured to disconnect the first voltage regulator from the module under test after the second voltage regulator begins provision of the test supply voltage.

5. The integrated circuit of claim 1 wherein the supply current monitoring circuit further comprises a memory element configured to store a reference current value associated with the module under test, and the supply current monitoring circuit is further configured to compare the supply current with the reference current value.

6. The integrated circuit of claim 5 wherein the supply current monitoring circuit further comprises an indication circuit configured to provide an indication of a difference between the supply current and the reference current value, wherein a malfunction of the module under test is indicated when the difference is outside of a threshold range.

7. The integrated circuit of claim 1 further comprising a regulator system having a first output and a second output, wherein the first and second voltage regulators are combined in the regulator system, the supply voltage to the multiple functional modules is provided via the first output and the test supply voltage to the module under test is provided via the second output.

8. The integrated circuit of claim 1 wherein the switch matrix comprises:

multiple first switches, each first switch being connected between the first voltage regulator and a respective one of the multiple functional modules; and
multiple second switches, each second switch being connected between the supply current monitoring circuit and the respective one of the multiple functional modules;
wherein each functional modules is selectively connectable to the first voltage regulator and the supply current monitoring circuit via the respective first and second switches.

9. The integrated circuit of claim 1 wherein:
a first functional module of the multiple functional modules has a nominal total supply current that is above a current measurement range of the current monitor, the first functional module is divided into a multiple functional subdomains, each of the multiple functional subdomains being configured to have a subdomain supply current that is within the current measurement range of the current monitor; and
the switch matrix comprises:
multiple supply switches for connection between the first voltage regulator and corresponding ones of the functional subdomains of the first functional module for providing the supply voltage to the multiple functional subdomains of the first functional module; and
multiple test switches for connection between the supply current monitoring circuit and the corresponding ones of the multiple functional subdomains, wherein when the first functional module is the module under test, the switch matrix is configured to, for each of the functional subdomains of the first functional module in successive order, disconnect the first voltage regulator from the functional subdomain via one of the multiple supply switches and connect the supply current monitoring circuit to the functional subdomain via one of the multiple test switches such that the second voltage regulator provides the test supply voltage to the functional subdomain and the current monitor measures the supply current of the functional subdomain in response to the test supply voltage.

10. The integrated circuit of claim 1 wherein:
a first functional module of the multiple functional modules has a nominal total supply current that is below a current measurement range of the current monitor;
the integrated circuit further comprises a current source associated with the first functional module; and
the switch matrix comprises:
a first switch for connection between the first voltage regulator and the first functional module for providing the supply voltage to the first functional module;
a second switch for connection between the supply current monitoring circuit and the first functional module; and
a third switch for connection between the supply current monitoring circuit and the current source, wherein when the first functional module is the module under test, the switch matrix is configured to disconnect the first voltage regulator from the first functional module via the first switch, connect the supply current monitoring circuit to the first functional module via the second switch, and connect the supply current monitoring circuit to the current source via the third switch such that the second voltage regulator provides the test supply voltage to the first functional module, the first functional module produces the supply current in response to the test supply voltage, a dump current from the current source is added to the supply current to obtain a total current within the current measurement range of the current monitor, and the current monitor measures the total current of the first functional module in response to the test supply voltage.

11. A method comprising:
providing a supply voltage from a first voltage regulator to multiple functional modules of a load circuit of an integrated circuit in a functional mode; and
testing each of the functional modules, wherein the functional module undergoing testing is a module under test, and the testing comprises:
disconnecting the first voltage regulator from the module under test;
connecting a supply current monitoring circuit to the module under test;
providing a test supply voltage from a second voltage regulator of the supply current monitoring circuit; and
measuring, at a current monitor of the supply current monitoring circuit, a supply current of the module under test in response to providing the test supply voltage.

12. The method of claim 11 wherein the test supply voltage is equivalent to the supply voltage required by the module under test.

13. The method of claim 11 wherein the method further comprises continuing provision of the supply voltage to the remaining functional modules that are not undergoing the testing.

14. The method of claim 11 wherein:
the connecting the supply current monitoring circuit is performed at a first instant during which the first voltage regulator is providing the supply voltage to the module under test; and
the disconnecting the first voltage regulator from the module under test is performed at a second instant following the first instant.

15. The method of claim 14 further comprising:
performing the providing the test supply voltage during the first and second instants; and
performing the measuring the supply current after the disconnecting the first voltage regulator.

16. The method of claim 11 wherein the testing further comprises:
comparing the supply current with a reference current value associated with the module under test; and
determining a functionality of the module under test in response to the comparing.

17. An integrated circuit comprising:
a load circuit having multiple functional modules;
a first voltage regulator configured to provide a supply voltage to the multiple functional modules;
a supply current monitoring circuit including a second voltage regulator and a current monitor, the second voltage regulator being configured to provide a test supply voltage; and
a switch matrix interconnected between the first voltage regulator, the supply current monitoring circuit, and the functional modules, wherein each of the functional modules in successive order is a module under test, and for the module under test, the switch matrix is configured to connect the supply current monitoring circuit to the module under test such that the second voltage regulator provides the test supply voltage to the module under test and the current monitor measures a supply current of the module under test in response to the test supply voltage, the switch matrix is further configured to disconnect the first voltage regulator from the module under test after the second voltage regulator of the supply current monitoring circuit begins providing the test supply voltage to the module under test, and the switch matrix is further configured to enable continued connection of the first voltage regulator to the remaining ones of the multiple functional modules to provide the supply voltage to the remaining ones of the multiple functional modules while the module under test is connected to the supply current monitoring circuit.

18. The integrated circuit of claim 17 wherein the supply current monitoring circuit further comprises:

a memory element configured to store a reference current value associated with the module under test; and an indication circuit configured to provide an indication of a difference between the supply current and the reference current value, wherein a malfunction of the module under test is indicated when the difference is outside of a threshold range.

19. The integrated circuit of claim 17 wherein the switch matrix comprises:

multiple first switches, each first switch being connected between the first voltage regulator and a respective one of the multiple functional modules; and multiple second switches, each second switch being connected between the supply current monitoring circuit and the respective one of the multiple functional modules;

wherein each functional modules is selectively connectable to the first voltage regulator and the supply current monitoring circuit via the respective first and second switches.

* * * * *